United States Patent
Lim et al.

(10) Patent No.: US 8,242,011 B2
(45) Date of Patent: Aug. 14, 2012

(54) METHOD OF FORMING METAL PILLAR

(75) Inventors: Zheng-Yi Lim, Hsinchu (TW); Yi-Wen Wu, Xizhi (TW); Wen-Hsiung Lu, Jhonghe (TW); Chih-Wei Lin, Xinfeng Township (TW); Tzong-Huann Yang, Taipei (TW); Hsiu-Jen Lin, Zhubei (TW); Ming-Da Cheng, Jhubei (TW); Chung-Shi Liu, Shinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/004,376

(22) Filed: Jan. 11, 2011

(65) Prior Publication Data

US 2012/0178251 A1  Jul. 12, 2012

(51) Int. Cl.
*H01L 21/44* (2006.01)
(52) U.S. Cl. .. 438/613; 438/612; 438/614; 257/E21.476
(58) Field of Classification Search .................. 438/612, 438/613, 614
See application file for complete search history.

(56) References Cited

U.S. PATENT DOCUMENTS

| | | | |
|---|---|---|---|
| 6,518,168 B1 * | 2/2003 | Clem et al. | 438/623 |
| 2003/0207778 A1 * | 11/2003 | So et al. | 510/175 |
| 2005/0003652 A1 * | 1/2005 | Ramanathan et al. | 438/616 |
| 2009/0023288 A1 * | 1/2009 | Jeong et al. | 438/670 |
| 2010/0200842 A1 * | 8/2010 | Park et al. | 257/40 |
| 2011/0027944 A1 * | 2/2011 | Liu et al. | 438/124 |

* cited by examiner

*Primary Examiner* — Angel Roman
(74) *Attorney, Agent, or Firm* — Lowe Hauptman Ham & Berner, LLP (57) ABSTRACT

The disclosure relates to fabrication of to a metal pillar. An exemplary method of fabricating a semiconductor device comprises the steps of providing a substrate having a contact pad; forming a passivation layer extending over the substrate having an opening over the contact pad; forming a metal pillar over the contact pad and a portion of the passivation layer; forming a solder layer over the metal pillar; and causing sidewalls of the metal pillar to react with an organic compound to form a self-assembled monolayer or self-assembled multi-layers of the organic compound on the sidewalls of the metal pillar.

20 Claims, 13 Drawing Sheets

METHOD OF FORMING METAL PILLAR

FIELD

The disclosure relates to integrated circuit fabrication and, more particularly, to a metal pillar.

BACKGROUND

Flip-chip bonding utilizes bumps to establish electrical contact between a chip's contact pads and a package substrate. Structurally, a bump structure actually contains a bump itself and a so-called under bump metallurgy (UBM) layer located between the bump and a contact pad. An UBM layer generally comprises a diffusion barrier layer (or a glue layer) and a seed layer, arranged in that order, on the contact pad. The bumps themselves, based on the material used, are classified as solder bumps, gold bumps, copper pillar bumps and bumps with mixed metals. Recently, copper pillar bump technology has been proposed. Compared with circuits using a solder bump, the circuit connected to a package substrate by a copper pillar bump has a finer pitch with minimum probability of bump bridging, reduces the capacitance load for the circuits, and allows the electronic component to perform at higher frequencies.

However, there are challenges to implementing such features and processes in IC fabrication. For example, poor adhesion of an electronic component to a package substrate due to oxidation of copper pillar. Accordingly, what is needed is a method for protecting a copper pillar.

SUMMARY

In one embodiment, a method of fabricating a semiconductor device comprises the steps of providing a substrate having a contact pad; forming a passivation layer extending over the substrate having an opening over the contact pad; forming a metal pillar over the contact pad and a portion of the passivation layer; forming a solder layer over the metal pillar; and causing sidewalls of the metal pillar to react with an organic compound to form a self-assembled monolayer of the organic compound on the sidewalls of the metal pillar.

In another embodiment, a method of fabricating a semiconductor device comprises the steps of providing a substrate having a contact pad; forming a passivation layer extending over the substrate having an opening over the contact pad; forming a metal pillar over the contact pad and a portion of the passivation layer; forming a solder layer over the metal pillar; and causing sidewalls of the metal pillar to react with an organic compound to form self-assembled multi-layers of the organic compound on the sidewalls of the metal pillar.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Figure 1:
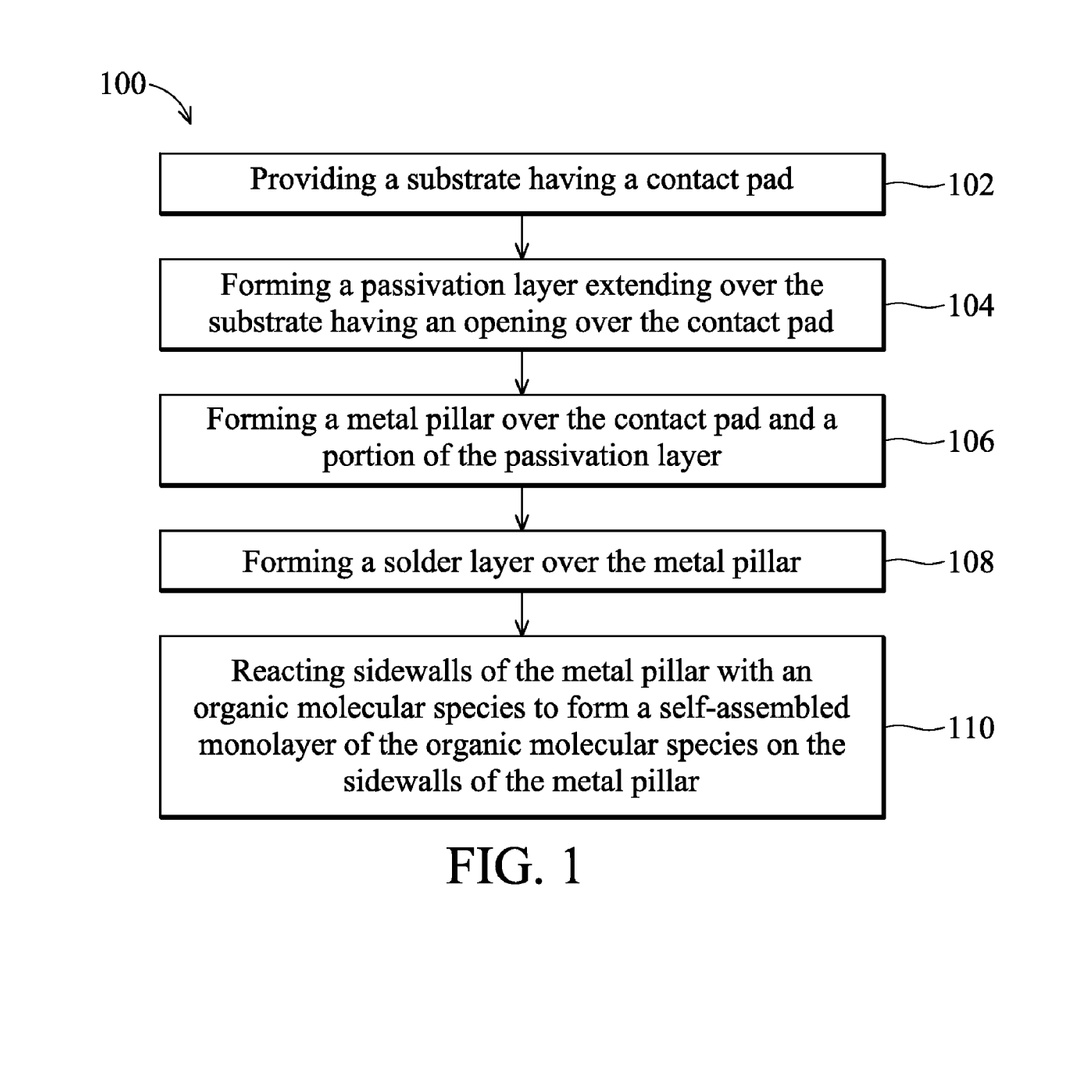
FIG. 1 is a flowchart illustrating a method of fabricating a semiconductor device comprising a metal pillar according to various aspects of the present disclosure.

Referring to FIG. 1, illustrated is a flowchart of a method 100 of fabricating a semiconductor device comprising a metal pillar according to various aspects of the present disclosure. The method 100 begins with step 102 in which a substrate having a contact pad is provided. The method 100 continues with step 104 in which a passivation layer extending over the substrate having an opening over the contact pad is formed. The method 100 continues with step 106 in which a metal pillar is formed over the contact pad and a portion of the passivation layer. The method 100 continues with step 108 in which a solder layer is formed over the metal pillar. The method 100 continues with step 110 in which sidewalls of the metal pillar are caused to react with an organic compound to form a self-assembled monolayer of the organic compound on the sidewalls of the metal pillar. The discussion that follows illustrates an embodiment of a method in accordance with FIG. 1.

FIGS. 2A-2H show schematic cross-sectional views of a metal pillar 220 of a semiconductor device 200 at various stages of fabrication of the method of FIG. 1. It is noted that the method of FIG. 1 does not produce a completed semiconductor device 200. Accordingly, it is understood that additional processes may be provided before, during, and after the method 100 of FIG. 1, and that some other processes may only be briefly described herein. Also, FIGS. 2A through 2H are simplified for a better understanding of the inventive concepts of the present disclosure. For example, although the figures illustrate the metal pillar 220 of a semiconductor device 200, it is understood that the semiconductor device 200 may be part of an IC package that further comprises a number of other components such as under-fill, lead-frame, etc.

Figure 2A:
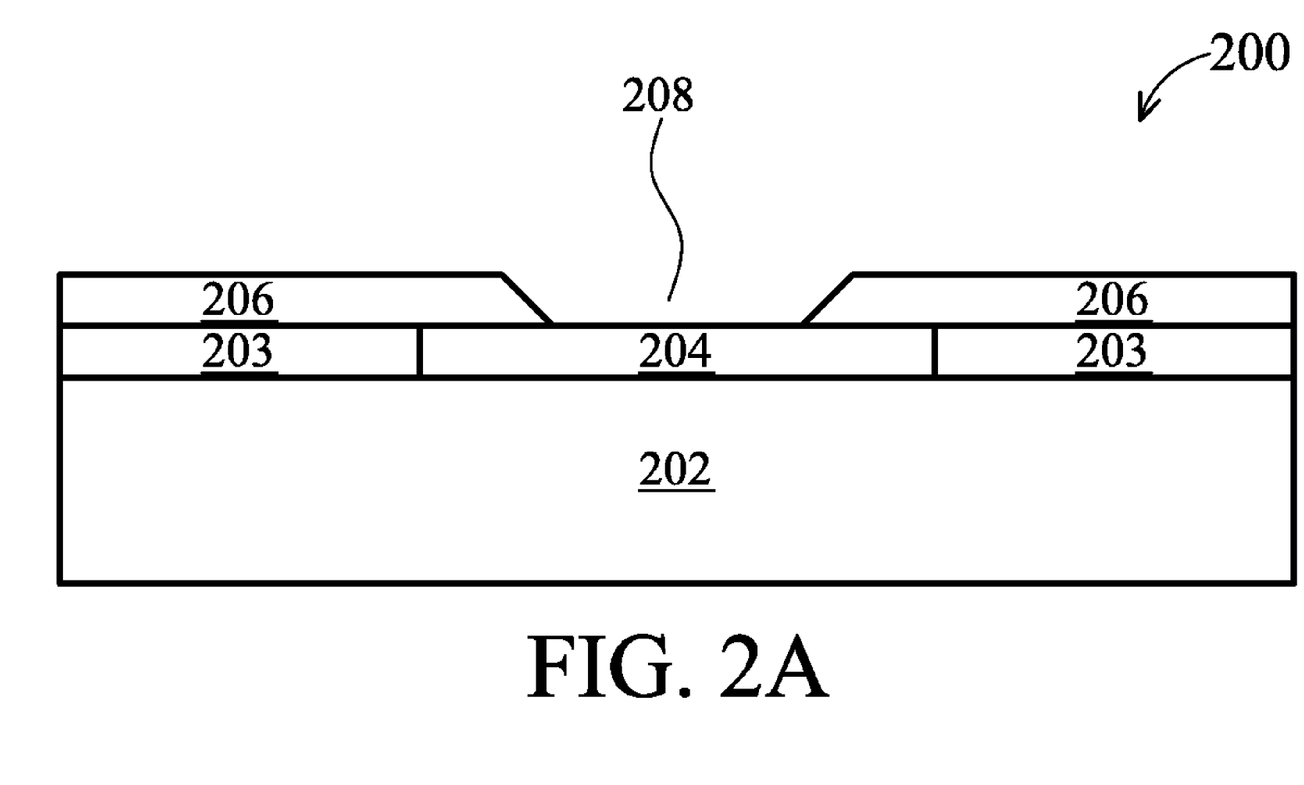
FIGS. 2A-2H show schematic cross-sectional views of a metal pillar of a semiconductor device at various stages of fabrication according to various aspects of the present disclosure.

Referring to FIG. 2A, a substrate 202 is provided. The step of providing a substrate 202 may further comprise partially fabricating one or more contact pads 204 on the substrate 202.

The substrate 202 may comprise a silicon substrate. The substrate 202 may alternatively comprise silicon germanium, gallium arsenic, or other suitable semiconductor materials. Furthermore, the substrate 202 may be a semiconductor on insulator such as silicon on insulator (SOI) or silicon on sapphire. In other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure.

The substrate 202 may further comprise a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the substrate 202 include transistors (e.g., p-channel/n-channel metal oxide semiconductor field effect transistors (pMOSFETs/nMOSFETs), bipolar junction transistors (BJTs), high voltage transistor, high frequency transistor, etc.); diodes; resistors; capacitors; inductors; fuses; and/or other suitable elements. Various processes are performed to form the various microelectronic elements including deposition, photolithography, implantation, etching, annealing, and/or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and/or other suitable types of devices.

The substrate 202 further comprises inter-layer dielectric (ILD) layers, inter-metal dielectric (IMD) layers and a metallization structure overlying the integrated circuit device. The IMD layers in the metallization structure include low dielectric constant (low-k) dielectric materials, un-doped silicate glass (USG), fluorine-doped silicate glass (FSG), carbon-doped silicate glass, silicon nitride, silicon oxynitride, or other commonly used materials. The dielectric constants (k value) of the low-k dielectric materials may be less than about 3.9, or less than about 2.3. Metal lines in the metallization structure may be formed of aluminum, aluminum alloy, copper, copper alloys, or other conductive materials. One skilled in the art will realize the formation details of the metallization structure.

A contact pad 204 is a top metallization layer formed in a top-level IMD layer 203, which is a portion of conductive routes and has an exposed surface treated by a planarization process, such as chemical mechanical polishing (CMP), if necessary. Suitable materials for the contact pad 204 may comprise, but are not limited to, for example aluminum, aluminum alloy, copper, copper alloys, or other conductive materials. The contact pad 204 is used in the bonding process to connect the integrated circuits in the respective chip to external features.

Then, a passivation layer 206 is formed extending over the substrate 202 and patterned to form a first opening 208 overlying and exposing a portion of the contact pad 204 for allowing subsequent metal pillar bump processes. The passivation layer 206 is formed of a non-organic material comprising un-doped silicate glass (USG), silicon nitride, silicon oxynitride, silicon oxide, or combinations thereof. In some alternative embodiments, the passivation layer comprises a polymer layer, such as an epoxy, polyimide, benzocyclobutene (BCB), polybenzoxazole (PBO), or the like, although other relatively soft, often organic, dielectric materials can also be used. In at least one embodiment, the passivation layer 206 may be formed using a chemical vapor deposition (CVD), high density plasma CVD (HDP CVD), sub-atmospheric CVD (SACVD), physical vapor deposition (PVD), or spin-on process.

Figure 2B:
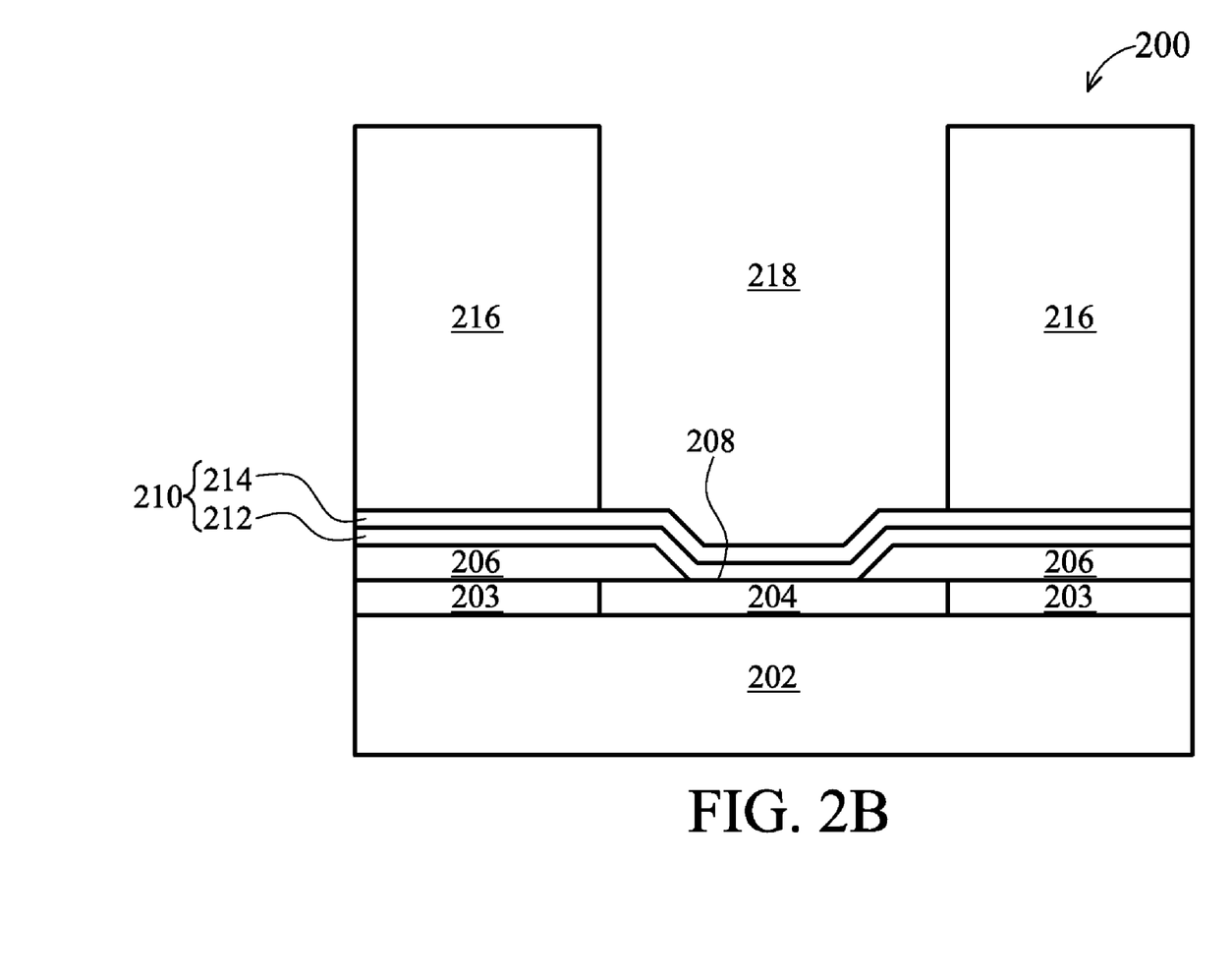

Referring to FIG. 2B, after the first opening 208 formation process in the passivation layer 206, an under-bump-metallurgy (UBM) layer 210 is formed over the contact pad 204 and passivation layer 206. The UBM layer 210 comprises applicable UBM material(s) formed to have a single layer or multi-layer structure. In the present embodiment, the UBM layer 210 comprises a first under-bump-metallurgy (UBM) sub-layer 212 and a second under-bump-metallurgy (UBM) sub-layer 214 over the first UBM sub-layer 212.

In the present embodiment, the first UBM sub-layer 212 is formed on the exposed portion of the bond pad 204, and extends to a portion of the passivation layer 206. The first UBM sub-layer 212, also referred to as a diffusion barrier layer or a glue layer, comprises titanium, tantalum, titanium nitride, tantalum nitride, or the like by PVD or sputtering. The first UBM sub-layer 212 is deposited to a thickness ranging from about 500 to 1200 angstroms. In at least one embodiment, the second UBM sub-layer 214, also referred to as a seed layer, is formed of copper by PVD or sputtering. In another embodiment, the second UBM sub-layer 214 may be formed of copper alloys that comprise silver, chromium, nickel, tin, gold, or combinations thereof. The second UBM sub-layer 214 is deposited to a thickness ranging from about 2000 to 7000 angstroms.

A photo-sensitive layer 216 is then formed over the UBM layer 210. The photo-sensitive layer 216 may be a dry film or a photo-resist film having a thickness ranging from about 40 micrometers (μm) to about 120 μm. It is understood that, in some embodiments, the thickness of the photo-sensitive layer 216 can be controlled and selected to be a predetermined value according to the thickness of the column of a to-be-formed metal pillar bump material. In the present embodiment, the photo-sensitive layer 216 is patterned by conventional processes to form the second opening 218 surrounding the first opening 208 of the passivation layer 206. The second opening 218 exposes a portion of the UBM layer 210 for defining a window of a metal pillar 220 (shown in FIGS. 2C through 2H and 4A through 4C).

It should be noted that a larger cross-sectional area of the metal pillar 220 provides higher mechanical strength and lower resistance for flip-chip bonding. As such, the photo-sensitive layer 216 is not only arranged to have a predetermined thickness for forming metal pillar 220, the second opening 218 is also arranged to have a width wider than the first opening 208 of the passivation layer 206, thereby providing a larger cross-sectional area to lower the resistance of metal pillar 220.

Figure 2C:
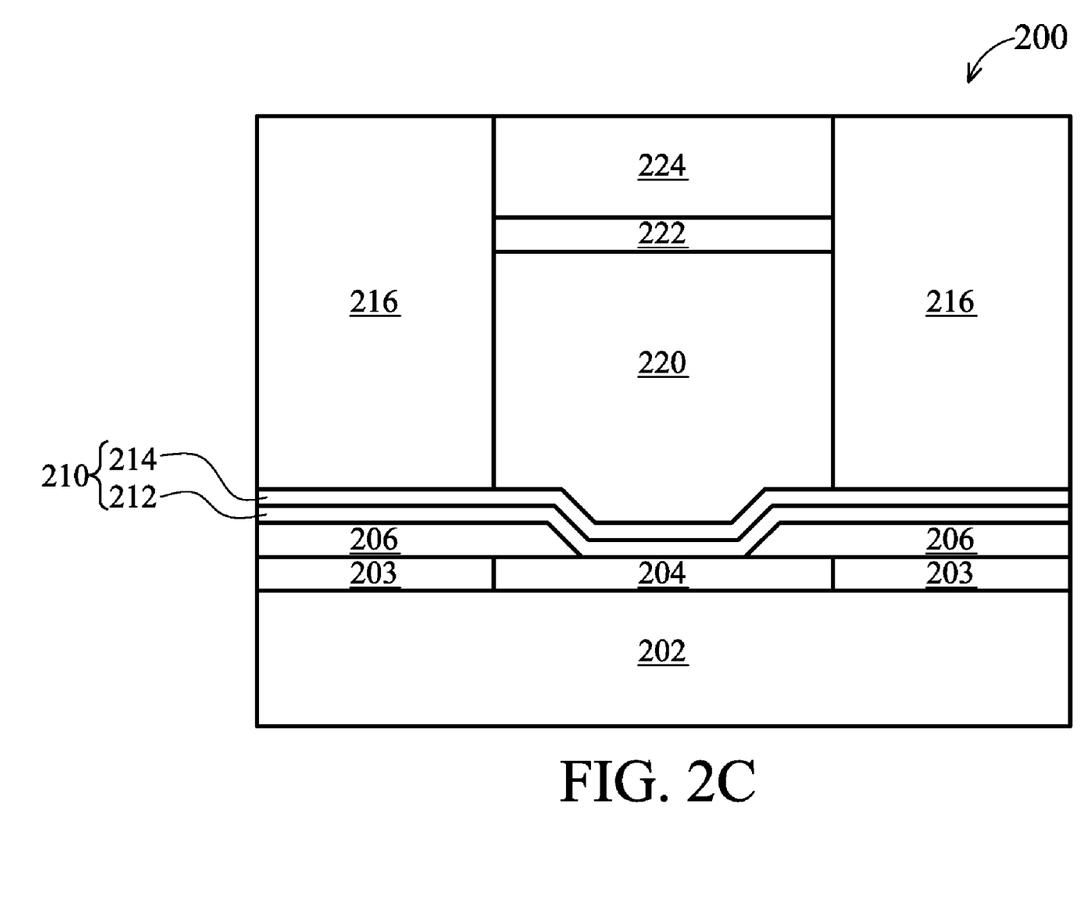

The second opening 218 is then partially filled with a metal material with solder wettability. With reference to FIG. 2C, in some embodiments, a metal layer 220 is formed upward along the second opening 218 using the underlying UBM layer 210 as a seed layer. In the present embodiment, the metal layer 220 comprises a copper layer. The copper layer is intended to comprise substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The metal layer 220 and the second UBM sub-layer 214 may comprise the same material such as copper.

The formation of the copper layer 220 is performed by methods include sputtering, printing, electro plating, electro-less plating, and/or CVD. For example, electro-chemical plating (ECP) is carried out to form the metal layer 220. In an exemplary embodiment, the thickness of the metal layer 220 is greater than 15 μm. In another exemplary embodiment, the thickness of the metal layer 220 is greater than 40 μm. For example, the metal layer 220 has a thickness of about 40-60 μm, or about 60-120 μm, although the thickness may be greater or smaller. The metal layer 220 is referred to as a metal pillar 220 hereinafter.

Further, a metal cap layer 222 is formed on the top surface of the metal pillar 220 within the opening 218 of the photo-sensitive layer 216. The metal cap layer 222 could act as a barrier layer to prevent copper in the metal pillar 220 to diffuse into bonding material, such as solder alloy, that is used to bond the substrate 202 to external features. The prevention of copper diffusion increases the reliability and bonding strength of the package. The metal cap layer 222 is a metallization layer which may include nickel, tin, gold, silver, palladium, indium, tin-lead (SnPb), nickel-palladium-gold (NiPdAu), nickel-gold (NiAu), other similar materials, or alloys. The metal cap layer 222 may comprise a single-layered structure or a multi-layered structure. In at least one embodiment, the metal cap layer 222 has a thickness of about 1-5 μm.

A solder layer 224 is then formed over the metal cap layer 222 within the opening 218 of the photo-sensitive layer 216. The solder layer 224 serves as a connecting terminal of the substrate 202. The solder layer 224 may be made of Sn, SnAg, Sn—Pb, SnAgCu (with Cu weight percentage less than 0.5%), SnAgZn, SnZn, SnBi—In, Sn—In, Sn—Au, SnPb, SnCu (with Cu weight percentage less than 0.7%), SnZnIn, or SnAgSb, etc. In at least one embodiment, the solder layer 224 is formed of a lead-free solder material layer.

Figure 2D:
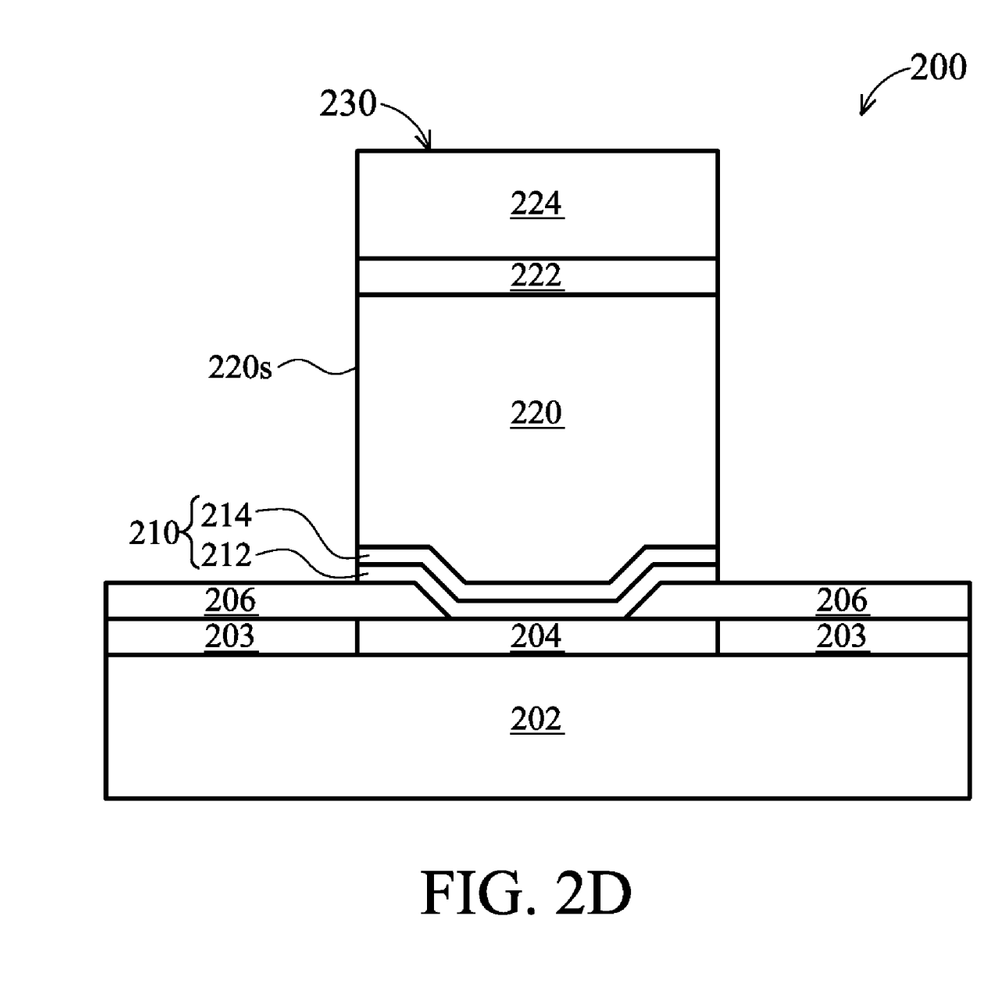

Referring to FIG. 2D, after formation of the solder layer 224 within the opening 218 of the photo-sensitive layer 216, the photo-sensitive layer 216 is removed using applicable wet etching or dry etching processes to expose portions of the UBM layer 210. In the case the photo-sensitive layer 216 is a dry film, it may be removed using an alkaline solution. The resulting structure includes the metal pillar 220, the metal cap layer 222 and the solder layer 224, and the sidewalls 220s of the metal pillar 220 are also exposed.

And then, using the resulting structure (comprising layers 220, 222 and 224) as a hard-mask, the exposed portions of the second UBM sub-layer 214 are etched back by an applicable wet and/or dry etching process depending on the metallurgy of the UBM material. In at least one embodiment, the wet etching process comprises removing a portion of the second UBM sub-layer 214 comprising copper in a solution comprising $H_3PO_3$ and $H_2O_2$.

Further, using the resulting structure (now comprising layers 220, 222, 224, and second UBM sub-layer 214) as a hard-mask, a portion of the first UBM sub-layer 212 is then removed to expose the passivation layer 206 by an applicable wet and/or dry etching process. In at least one embodiment, in which the first UBM sub-layer 212 comprises titanium, tantalum, titanium nitride, or tantalum nitride, the step of the dry etching process to remove a portion of the first UBM sub-layer 212 is performed using F, Cl, or Br based etchants.

Thereafter, the semiconductor device 200 of FIG. 2D is subjected to a reflow treatment to melt the solder layer 224 so that a hemisphere-shaped solder bump 224a is formed over the metal pillar 220 (shown in FIG. 2E), for example, either through the wafer heating or a rapid thermal processing (RTP). The process steps up to this point have provided the substrate 202 having a bump structure 230 comprising the metal pillar 220, the metal cap layer 222 and the hemisphere-shaped solder layer 224.

Figure 2E:
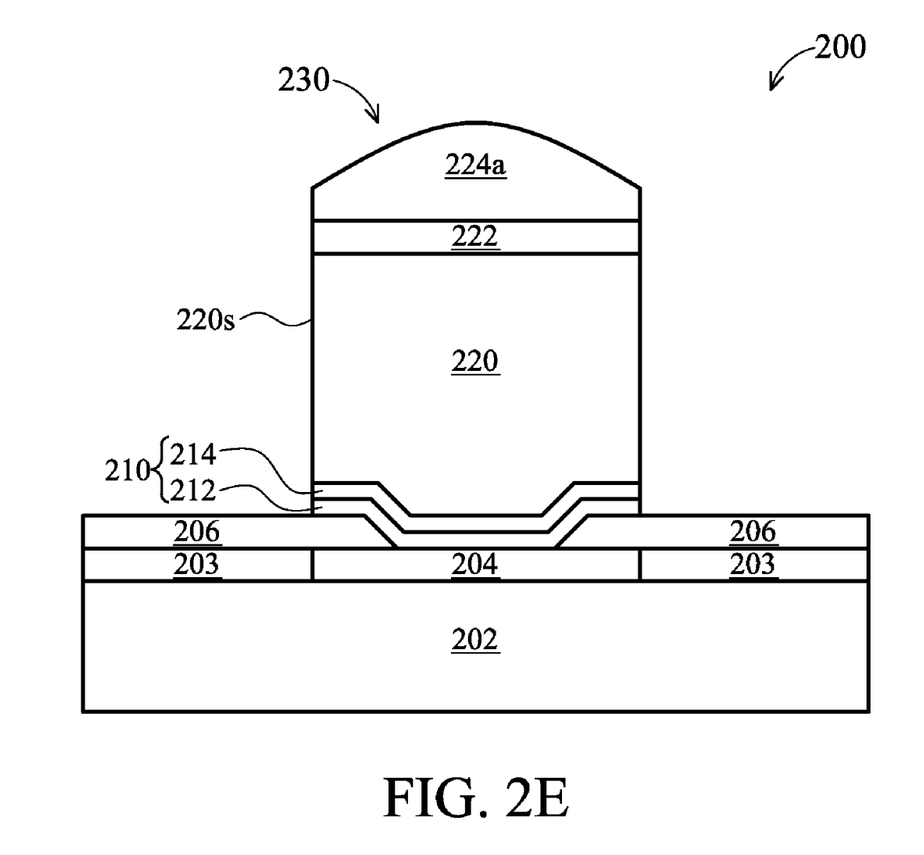

It should be noted that metal pillar 220 comprising copper, also referred to as a copper pillar 220, has a tendency to be oxidized during the manufacturing process. Oxidized copper pillar 220 may lead to poor adhesion of an electronic component to a substrate. The poor adhesion may cause serious reliability concerns due to high leakage currents. Oxidized copper pillar 220 may also lead to underfill cracking along the interface of the underfill and the copper pillar 220. The cracks may propagate to the underlying low dielectric constant (low-k) dielectric layers or to the solder used to bond the copper pillar 220 to the substrate.

Accordingly, the processing discussed below with reference to FIGS. 2F-2H and 4A-4C may form a sidewall protection layer to protect the exposed sidewalls 220s of the copper pillar 220. This sidewall protection layer protects copper pillar 220 against oxidation and improves device performance.

Figure 2F:
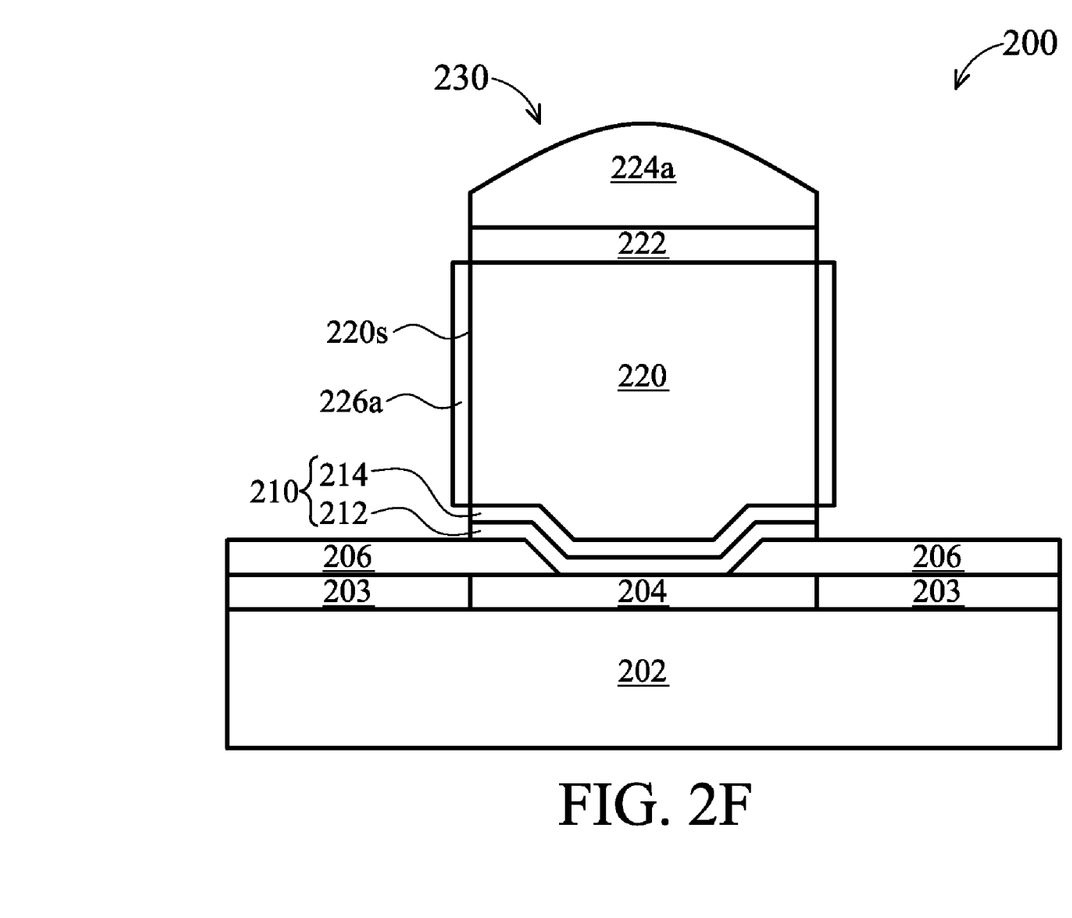

FIG. 2F shows the semiconductor device 200 of FIG. 2E after causing sidewalls 220s of the metal pillar 220 to react with an organic compound to form a self-assembled monolayer 226a of the organic compound on the sidewalls 220s of the metal pillar 220. In at least one embodiment, the organic compound comprises, but is not limited to, a head group, a functional group and a tail group between the head group and the functional group, wherein the head group is a thiol group (—SH). In some embodiments, the functional group comprises $CH_3$, OH, $NH_2$, and/or COOH; and the tail group comprises a carbon chain having carbon number between 4 and 20.

The film forming mechanism of the self-assembled monolayer 226a is chemical adsorption of the head group of the organic compound at the sidewalls 220s of the metal pillar 220 in a solution or in a vapor phase, followed by a slow two-dimensional organization of the tail group to form the self-assembled monolayer 226a of the organic compound on the sidewalls 220s of the metal pillar 220. In the present embodiment, the step of reacting sidewalls 220s of the metal pillar 220 with the organic compound is performed at a temperature of about 20 to 50° C. The metal pillar 220 is now ready to be soldered and will be protected against oxidation until the soldering step is performed.

In addition, the step of cleaning the sidewalls 220s of metal pillar 220 with de-ionized water, citric acid and isopropyl alcohol (IPA) may be performed before the step of causing the sidewalls 220s of the metal pillar 220 to react with the organic compound. Further, the step of treating the substrate 202 with IPA may be performed after the step of causing the sidewalls 220s of the metal pillar 220 to react with the organic compound.

Figure 2G:
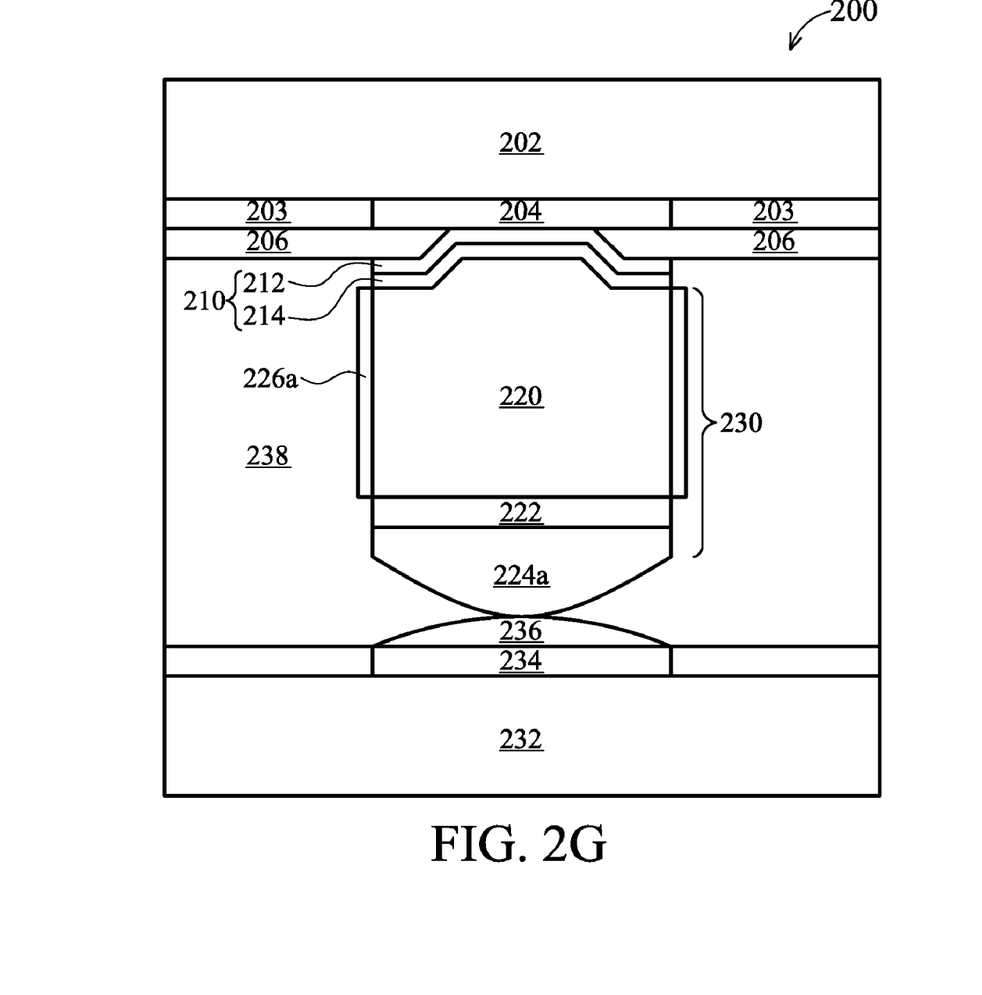
Figure 2H:
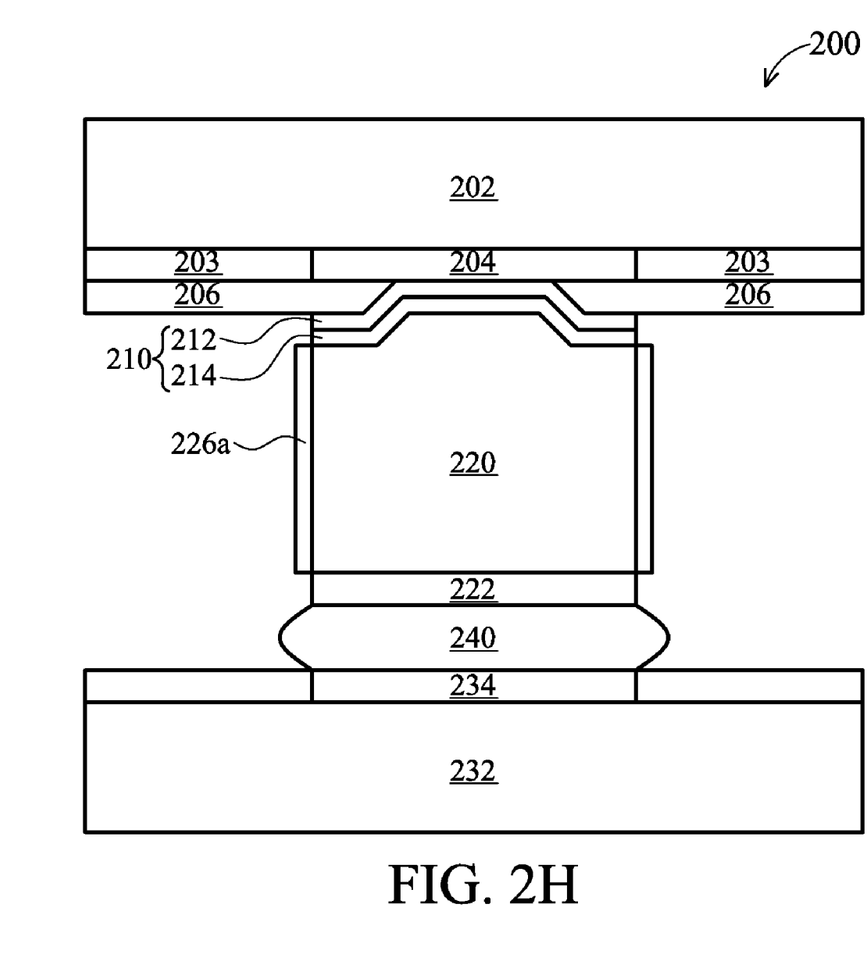

The substrate 202 is then sawed and connected to another substrate 232. The structure of FIG. 2G shows the substrate 202 is flipped upside down and attached to the substrate 232 at the bottom. The substrate 232 may be a package substrate, board (e.g., a print circuit board (PCB)), another die, or other suitable substrate. In the present embodiment, a pre-solder layer 236 is mounted on a contact pad 234 on the package substrate 232. A flux 238 is provided to surround the bump structure 230 and the pre-solder layer 236 between the substrate 202 and the package substrate 232.

Thereafter, the structure of FIG. 2G is heated to reflow the solder bump 224a and pre-solder layer 236 to form a joint structure 240 (FIG. 2H), which couples the two substrates 202, 232. The flux 238 is then removed for further processing. The substrate 202, the joint structure 240, and the package substrate 232 may be referred to as a packaging assembly, or in the present embodiment, a flip-chip packaging assembly (shown in FIG. 2H). It should be noted that the self-assembled monolayer 226a isolates the sidewalls 220s of the metal pillar 220 against oxidation before flux removal, thereby protecting the sidewalls 220s of the metal pillar 220. Accordingly, Applicant's method of fabricating a semiconductor device 200 may fabricate a metal pillar 220 with a protective self-assembled monolayer 226a to avoid poor adhesion of an electronic component to a substrate and improve device performance.

Figure 3:
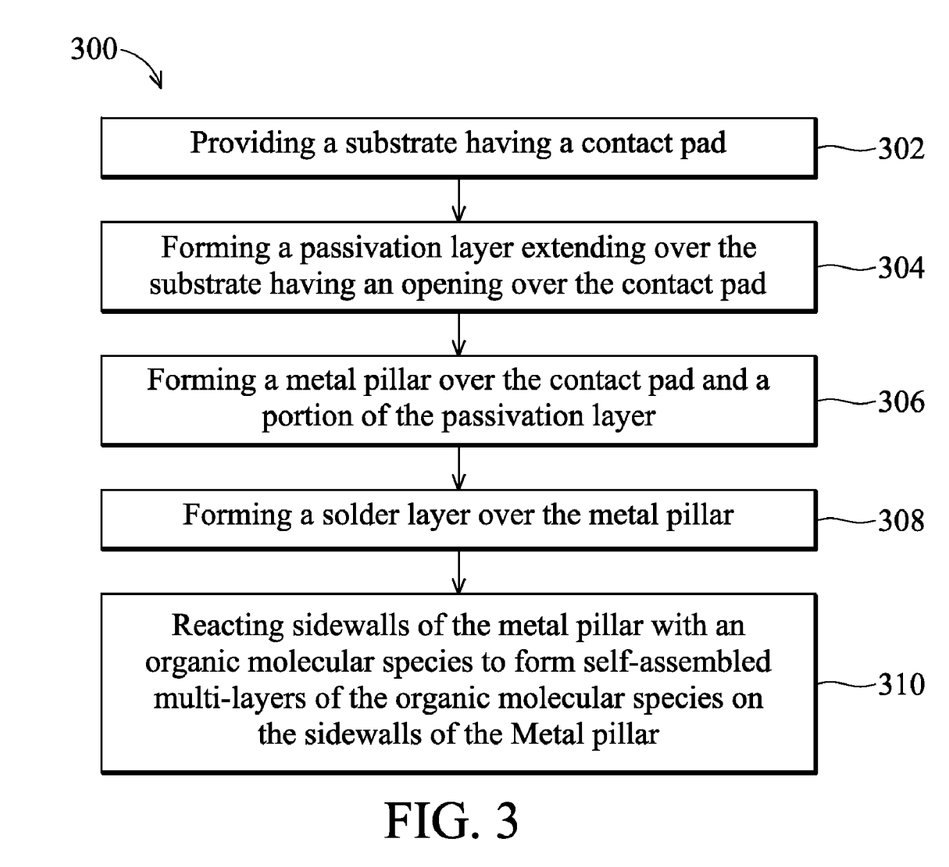
FIG. 3 is a flowchart illustrating a method of fabricating a semiconductor device comprising a metal pillar according to various aspects of the present disclosure.

FIG. 3 is a flowchart of another example method 300 of fabricating a semiconductor device comprising a metal pillar according to various aspects of the present disclosure. The method 300 begins with step 302 in which a substrate having a contact pad is provided. The method 300 continues with step 304 in which a passivation layer extending over the substrate having an opening over the contact pad is formed. The method 300 continues with step 306 in which a metal pillar is formed over the contact pad and a portion of the passivation layer. The method 300 continues with step 308 in which a solder layer is formed over the metal pillar. The method 300 continues with step 310 in which sidewalls of the metal pillar are caused to react with an organic compound to form self-assembled multi-layers of the organic compound on the sidewalls of the metal pillar. The discussion that follows illustrates an embodiment of a method in accordance with FIG. 3.

Figure 4A:
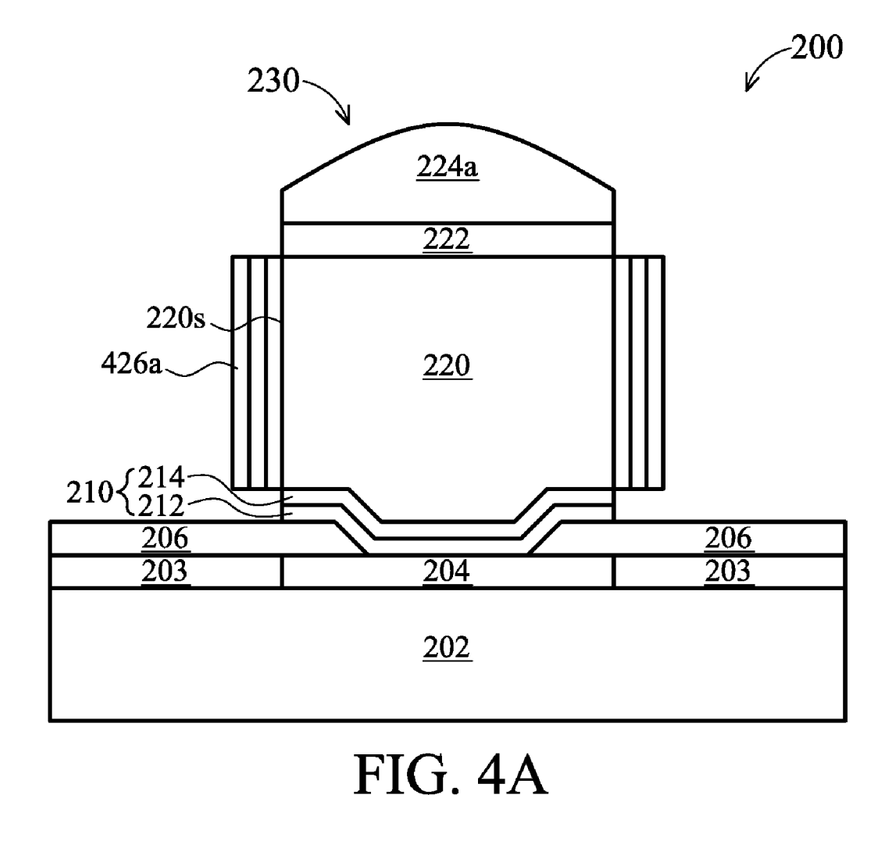
FIGS. 4A-4C show schematic cross-sectional views of a metal pillar of a semiconductor device at various stages of fabrication according to various aspects of the present disclosure.
Figure 4B:
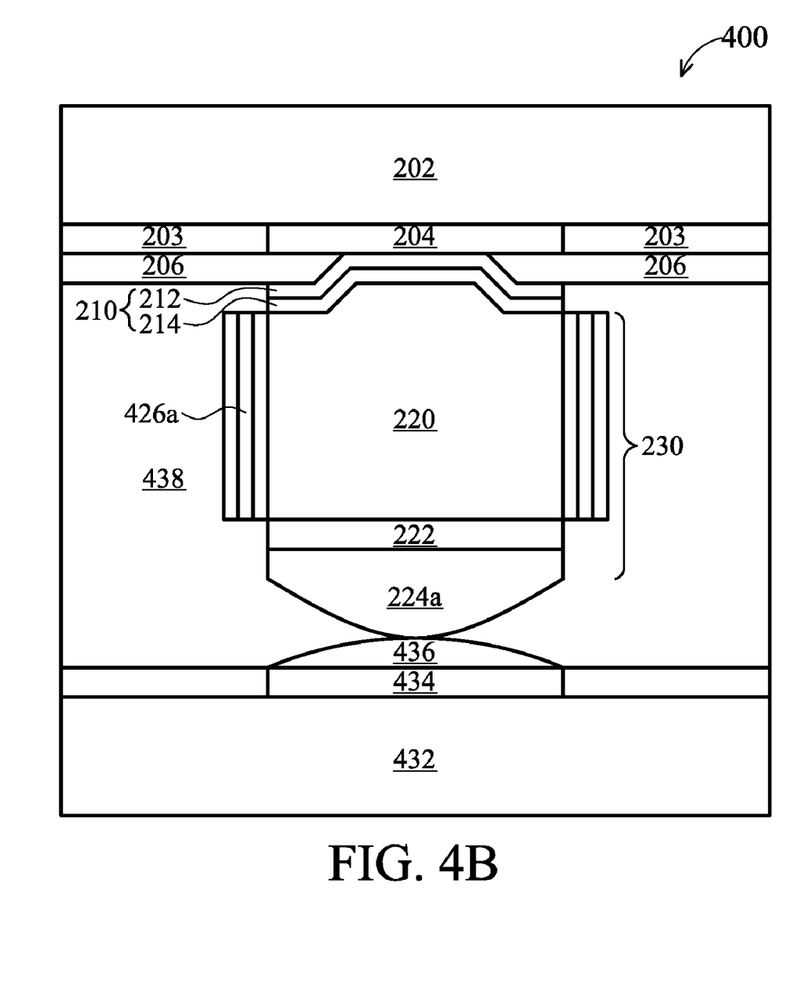
Figure 4C:
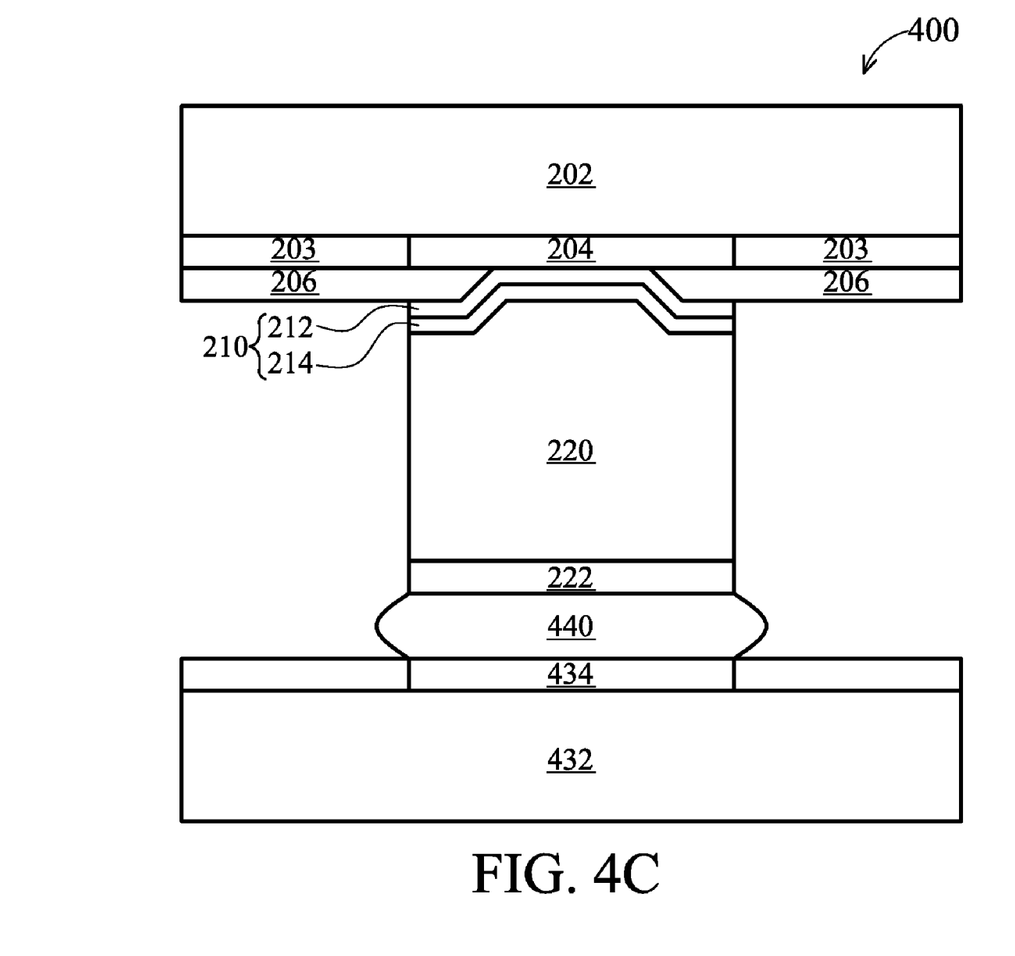

FIGS. 4A-4C show schematic cross-sectional views of a metal pillar 220 of a semiconductor device 400 at various stages of fabrication of the method of FIG. 3. It is noted that the method of FIG. 3 does not produce a completed semiconductor device 400. Accordingly, it is understood that additional processes may be provided before, during, and after the method 300 of FIG. 3, and that some other processes may only be briefly described herein. Also, FIGS. 4A through 4C are simplified for a better understanding of the inventive concepts of the present disclosure. For example, although the figures illustrate the metal pillar 220 of a semiconductor device 400, it is understood the semiconductor device 400 may be part of an IC package that further comprises a number of other components such as under-fill, lead-frame, etc.

FIG. 4A shows the semiconductor device 400 (similar to the semiconductor device 200 in FIG. 2E) after causing sidewalls 220s of the metal pillar 220 to react with an organic compound to form self-assembled multi-layers 426a of the organic compound 426 on the sidewalls 220s of the metal pillar 220. In the present embodiment, the step of causing sidewalls 220s of the metal pillar 220 to react with the organic compound 426 is performed at a temperature of about 20 to 50° C. in a solution. The solution comprises the organic compound and metal ions including zinc ions, copper ions, nickel ions, cobalt ions, iron ions, or combination thereof. In at least one embodiment, the organic compound comprises a benzimidazole or benzimidazole derivative, for example, 1-methylbenzimidazole or 2-trifluoromethylbenzimidazole. In another embodiment, the organic compound comprises an imidazole or imidazole derivative, for example, alkylimidazole or alkylbenzimidazole.

When the solution comprising the imidazole is applied to the sidewalls 220s of the metal pillar 220 comprising copper, the imidazole and copper ions from the copper surface react, forming insoluble copper-imidazole complexes which deposit on and form self-assembled multi-layers 426a on the sidewalls 220s of the metal pillar 220. Further, the metal ions added to the solution comprising the imidazole help to catalyze the rate of formation of the copper-imidazole complexes. The metal pillar 220 is now ready to be soldered and will be protected against oxidation until the soldering step is performed.

In addition, the step of cleaning the sidewalls 220s of metal pillar 220 with an acid solution may be performed before the step of causing sidewalls 220s of the metal pillar 220 to react with the organic compound. Further, the step of drying the substrate 202 with an inert gas may be performed after the step of causing sidewalls 220s of the metal pillar 220 to react with the organic compound.

The substrate 202 is then sawed and attached to another substrate 432. The structure of FIG. 4B shows the substrate 202 is flipped upside down and attached to the substrate 432 at the bottom. The substrate 432 may be a package substrate, board (e.g., a print circuit board (PCB)), the other die, or other suitable substrate. In the present embodiment, a pre-solder layer 436 is mounted on a contact pad 434 on the package substrate 432. A flux 438 is provided to surround the bump structure 230 and the pre-solder layer 436 between the substrate 202 and the package substrate 432.

Thereafter, the structure of FIG. 4B is heated to reflow the solder bump 224a and pre-solder layer 436 to form a joint structure 440 (FIG. 4C), which couples the two substrates 202, 432. The flux 438 is then removed for further processing. The substrate 202, the joint structure 440, and the package substrate 432 may be referred to as a packaging assembly, or in the present embodiment, a flip-chip packaging assembly (shown in FIG. 4C). It should be noted that the self-assembled multi-layers 426a isolate the sidewalls 220s of the metal pillar 220 against oxidation before flux removal, thereby protecting the sidewalls 220s of the metal pillar 220. Accordingly, Applicant's method of fabricating a semiconductor device 400 may fabricate a metal pillar 220 with protective self-assembled multi-layers 426a to avoid poor adhesion of an electronic component to a substrate and upgrade device performance.

It is understood that the semiconductor devices 200, 400 may undergo further semiconductor manufacturing processes to form various features such as under-fill, lead-frame, etc.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a substrate having a contact pad;
   forming a passivation layer extending over the substrate and having an opening over the contact pad;
   forming a metal pillar over the contact pad and a portion of the passivation layer;
   forming a solder layer over the metal pillar; and
   causing sidewalls of the metal pillar to react with an organic compound to form a self-assembled monolayer of the organic compound on the sidewalls of the metal pillar.

2. The method of claim 1, wherein the organic compound is in a solution.

3. The method of claim 2, wherein the step of reacting sidewalls of the metal pillar with an organic compound is performed at a temperature of about 20 to 50° C.

4. The method of claim 1, wherein the organic compound is in a vapor phase.

5. The method of claim 1, wherein the organic compound comprises a head group, a functional group and a tail group between the head group and the functional group.

6. The method of claim 5, wherein the head group is a thiol group (—SH).

7. The method of claim 5, wherein the functional group comprises $CH_3$, OH, $NH_2$, or COOH.

8. The method of claim 5, wherein the tail group comprises a carbon chain having carbon number between 4 and 20.

9. The method of claim 1, wherein the metal pillar is a copper pillar.

10. The method of claim 1 further comprising: cleaning the sidewalls of metal pillar with de-ionized water, citric acid and IPA before the reaction of the sidewalls of the metal pillar with an organic compound.

11. The method of claim 1 further comprising: treating the substrate with IPA after the reaction of the sidewalls of the metal pillar with an organic compound.

12. A method for fabricating a semiconductor device, comprising:
    providing a substrate having a contact pad;
    forming a passivation layer extending over the substrate having an opening over the contact pad;
    forming a metal pillar over the contact pad and a portion of the passivation layer;
    forming a solder layer over the metal pillar; and
    causing sidewalls of the metal pillar to react with an organic compound to form self-assembled multi-layers of the organic compound on the sidewalls of the metal pillar.

13. The method of claim 12, wherein the organic compound is in a solution.

14. The method of claim 13, wherein the solution comprises metal ions of zinc ions, copper ions, nickel ions, cobalt ions, iron ions, or combination thereof.

15. The method of claim 12, wherein the step of reacting sidewalls of the metal pillar with an organic compound is performed at a temperature of about 20 to 50° C.

16. The method of claim 12, wherein the organic compound comprises a benzimidazole or benzimidazole derivative.

17. The method of claim 12, wherein the organic compound comprises an imidazole or imidazole derivative.

18. The method of claim 12, wherein the metal pillar is a copper pillar.

19. The method of claim 12 further comprising: cleaning the sidewalls of metal pillar with an acid solution before the reaction of the sidewalls of the metal pillar with an organic compound.

20. The method of claim 12 further comprising: drying the substrate with an inert gas after the reaction of the sidewalls of the metal pillar with an organic compound.

* * * * *